(12) United States Patent
Liang et al.

(10) Patent No.: US 6,520,670 B2
(45) Date of Patent: Feb. 18, 2003

(54) LIGHT RADIATING DEVICE WITH LARGE BEAM SPOT SIZE AND SPATIAL OPTICAL COMMUNICATION DEVICE

(75) Inventors: Ji Hao Liang, Meguro (JP); Kazuhisa Ishii, Meguro (JP); Tsuyoshi Maruyama, Meguro (JP)

(73) Assignee: Stanley Electric Co., Ltd., Tokyo (JP)

( * ) Notice: Subject to any disclaimer, the term of this patent is extended or adjusted under 35 U.S.C. 154(b) by 23 days.

(21) Appl. No.: 09/938,324

(22) Filed: Aug. 23, 2001

(65) Prior Publication Data

US 2002/0024823 A1 Feb. 28, 2002

(30) Foreign Application Priority Data

Aug. 28, 2000 (JP) ........................................ 2000-257746

(51) Int. Cl.[7] .............................................. H01L 23/31
(52) U.S. Cl. ...................... 362/555; 362/800; 362/558; 257/79; 257/100
(58) Field of Search ................ 362/800, 555, 362/558, 311; 313/501; 257/79, 98, 100; 359/599

(56) References Cited

U.S. PATENT DOCUMENTS

| 3,937,949 A | * | 2/1976 | Ishikawa et al. ............. 250/216 |
| 5,535,230 A | * | 7/1996 | Abe ........................ 250/504 R |
| 6,042,256 A | * | 3/2000 | Gothard ....................... 362/153 |
| 6,353,491 B1 | * | 3/2002 | Tanaka et al. ................. 257/81 |

FOREIGN PATENT DOCUMENTS

| JP | 62-73785 | * | 4/1987 |
| JP | 6-238680 | * | 9/1990 |

* cited by examiner

Primary Examiner—Sandra O'Shea
Assistant Examiner—Hargobind S. Sawhney
(74) Attorney, Agent, or Firm—Frishauf, Holtz, Goodman & Chick, P.C.

(57) ABSTRACT

A light diffusion sheet receives light fluxes radiated from a light radiating element at a first plane of the light diffusion sheet and scatters or diffracts the received light fluxes, and radiates the scattered or diffracted light from an opposite second plane. A light distributing member distributes the light radiated from the second plane of the light diffusion sheet along some direction. A light radiating device is provided which has a relatively large light beam spot.

4 Claims, 3 Drawing Sheets

LIGHT RADIATING DEVICE WITH LARGE BEAM SPOT SIZE AND SPATIAL OPTICAL COMMUNICATION DEVICE

This application is based on Japanese Patent Application 2000-257746, filed on Aug. 28, 2000, the entire contents of which are incorporated herein by reference.

BACKGROUND OF THE INVENTION

A) Field of the Invention

The present invention relates to a light radiating device and a spatial optical communication device, and more particularly to a light radiating device for radiating light toward the space, and a spatial optical communication device using such a light radiating device.

B) Description of the Related Art

Super luminescent diodes (SLD) have been studied for applications to semiconductor optical amplifiers and optical fiber gyro power sources. Light output from SLD has low coherence. The operation of SLD relies upon suppression of laser oscillation. However, SL light is emitted via a waveguide having a optical gain so that it can be modulated at high speed. From this reason, SLD has drawn attention in terms of a high speed spatial optical communication element.

The light beam spot (near field pattern) of SLD is very small. Therefore, if super luminescent light (SL light) radiated from SLD is converged by a convex lens or the like, SL light concentrates upon a fine area. The power density of the area upon which SL light is converged becomes large. During spatial optical communication utilizing SL light, it is not preferable that a large power is concentrated upon an unexpected point in the space.

SUMMARY OF THE INVENTION

It is an object of the present invention to provide a light radiating device having a relatively large beam spot.

According to one aspect of the present invention, there is provided a light radiating device comprising: a light radiating element; a light diffusion sheet for receiving light fluxes radiated from the light radiating element at a first plane of the light diffusion sheet and scattering or diffracting the received light fluxes, and radiating the scattered or diffracted light from an opposite second plane; and a light distributing member for distributing the light radiated from the second plane of the light diffusion sheet in a direction.

According to another aspect of the present invention, there is provided a spatial optical communication device having the light radiating device and a light receiving element for receiving light distributed from the light distributing member of the light radiating device.

The light diffusion sheet can make large the light beam spot of a light radiating device. It is possible to prevent a large light power from concentrating upon an unexpected fine area.

DETAILED DESCRIPTION OF THE PREFERRED EMBODIMENTS

Figure 1:
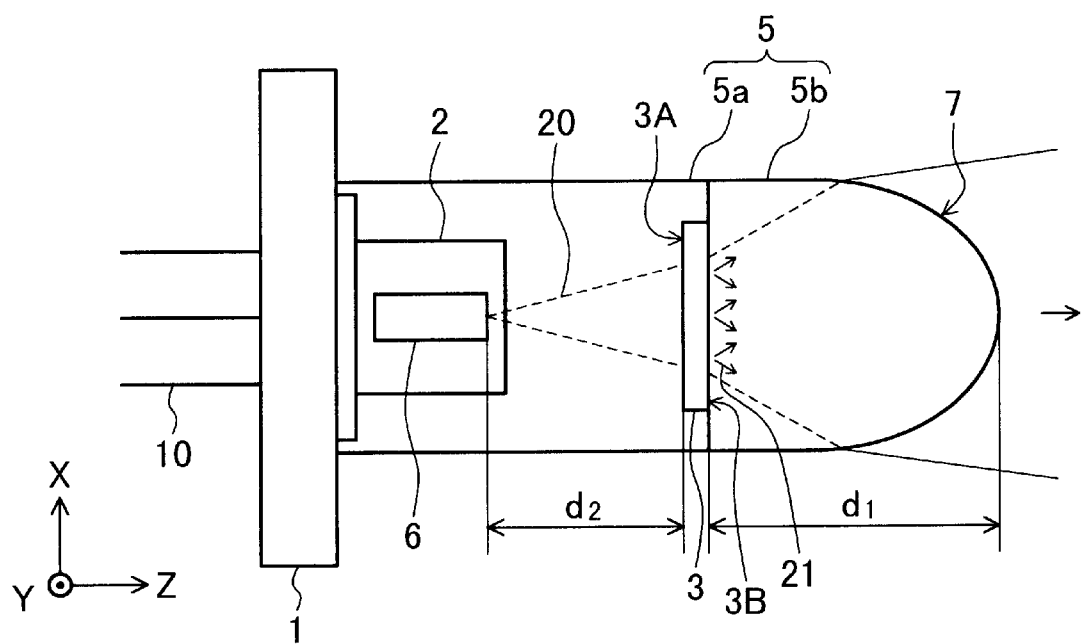
FIG. 1 is a side view of a light radiating device according to an embodiment of the invention.

FIG. 1 is a side view of a light radiating device according to an embodiment of the invention. On one surface (front surface) of a disc stem 1 having a diameter of 9 mm, a mount metal jig 2 is mounted which has a mount surface perpendicular to the front surface. Consider an XYZ rectangular coordinate system having an XY plane parallel to the front surface of the stem 1 and a ZX plane parallel to the mount surface of the mount metal jig 2. The direction of a normal vector to the front surface of the stem is assumed to be the positive direction of the Z axis. An SLD 6 is mounted on the mount surface of the mount metal jig 2. The thickness direction of an active layer of SLD 6 is parallel to the Y axis. Current is supplied to SLD 6 via lead wires 10 extending from the back surface of the stem 1 to the external. SLD 6 radiates SL light 20 having a wavelength in the infrared range, from its output edge along the normal direction (positive direction of the Z axis) to the front surface of the stem 1.

A light diffusion sheet 3 is disposed in the optical path of SL light 20, perpendicular to the optical axis (X axis) of SL light 20. SL light 20 becomes incident upon a first plane 3A of the light diffusion sheet 3. The light diffusion sheet 3 scatters the SL light 20 incident upon the first plane 3A, and radiates scattered light 21 from an opposite second plane 3B. As the light diffusion sheet 3, a diffraction grating sheet for diffracting incidence light may be used.

The mount metal jig 2, SLD 6 and light diffusion sheet 3 are molded in a molded block 5. The molded block 5 is made of, for example, epoxy resin.

On the surface of the molded block 5, a region 7 which the scattered light 21 radiated from the second plane 3B of the light diffusion sheet 3 reaches, is a hemisphere having a radius of 2.5 mm. This hemispherical region 7 distributes the scattered light 21 to the front surface (positive direction of the Z axis) of the light radiating device. The region 7 is not necessarily hemispherical. If the region has an outward convex surface, it is possible to distribute the scattered light 21 to the front surface of the light radiating device with the priority over other surfaces.

Next, a method of manufacturing the light radiating device shown in FIG. 1 will be described. First, a mold form is prepared which defines the surface of the molded block 5. Epoxy resin is filled in the front portion of this mold form and hardened.

A hemispherical portion defining the hemispherical region 7 and a front end portion 5b of a cylindrical shape continuous with the bottom of the hemispherical region 7 are therefore formed. In the state that the front end portion 5b is placed in the mold form, the bottom of the front end portion 5b is directed upward. The light diffusion sheet 3 is placed on the bottom of the front end portion.

Epoxy resin is filled in the mold form, and the mount metal jig 2 mounted on the stem 1 is inserted into the mold form. SLD 6 is already mounted on the mount metal jig 2. In this state, the epoxy resin is hardened. By dismounting the mold form, the light radiating device shown in FIG. 1 can be obtained.

Next, with reference to FIGS. 2A and 2B, the beam spot (near field pattern) of the light radiating device of this embodiment will be described.

Figure 2A:
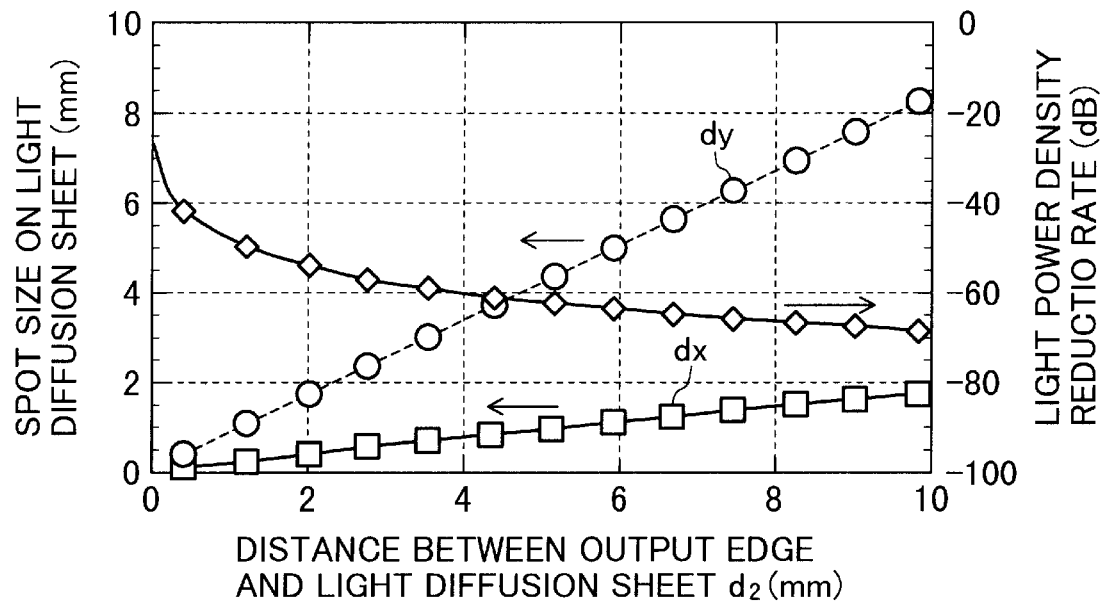
FIG. 2A is a graph showing a change in a spot size and a light power density reduction rate when a distance between an output edge and a light diffusion sheet is changed.
Figure 2B:
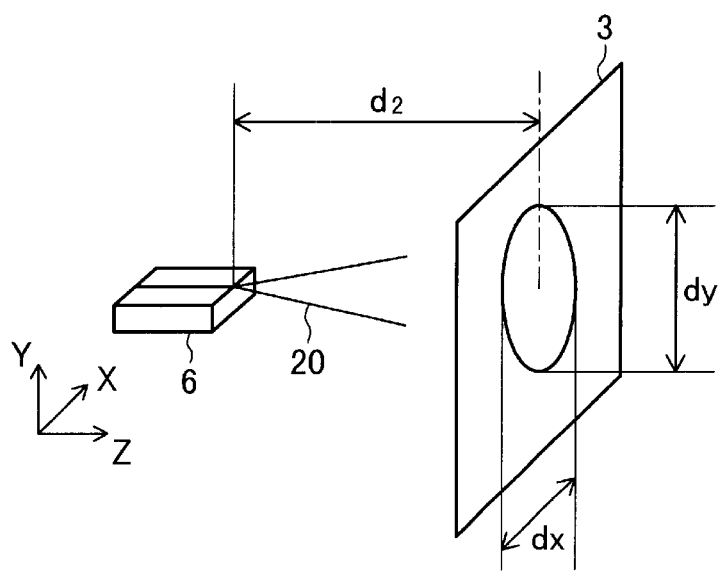
FIG. 2B is a perspective view illustrating a definition of a beam spot size.

As shown in FIG. 2B, a length along the X axis direction of a beam spot of SL light 20 on the first plane 3A of the light diffusion sheet 3 is represented by dx, and the length along the Y axis direction is represented by dy. A distance between the output edge of SLD 6 and light diffusion sheet 3 is represented by d2.

FIG. 2A is a graph showing changes in a beam spot size and a light power density when the distance d2 is changed. The abscissa represents the distance d2 in the unit of "mm", the left ordinate represents the beam spot size in the unit of "mm", and the right ordinate represents a light power density reduction rate in the unit of "dB". Square symbols and circle symbols in FIG. 2A represent the beam spot sizes dx and dy, respectively. Rhomboid symbols represent a light power density reduction rate.

It can be seen that as the distance d2 is elongated, the beam spot becomes large. For example, at the distance d2 of 2 mm, the beam spot is an elongated circle of 0.3 mm×1.7 mm. It can be seen that as the beam spot becomes large, the light power density lowers. The light radiating device shown in FIG. 1 has such a beam spot. In contrast, the beam spot size of SLD 6 is about 1 $\mu$m×3 $\mu$m. By disposing the light diffusion sheet 3, the beam spot can be made large. Even if the beam radiated from this light radiating device is converged, the beam cannot be converged in an area having the size of the beam spot or smaller. Therefore, it is possible for the SL light radiated from the light radiating device to prevent a high power from being concentrated upon an unexpected fine area.

Next, with reference to FIG. 3, the light distribution characteristics (far field pattern) of the light radiating device of the embodiment will be described. As shown in FIG. 1, the distance between the second plane 3B of the light diffusion sheet 3 and the front end of the hemispherical region 7 is represented by d1.

Figure 3:
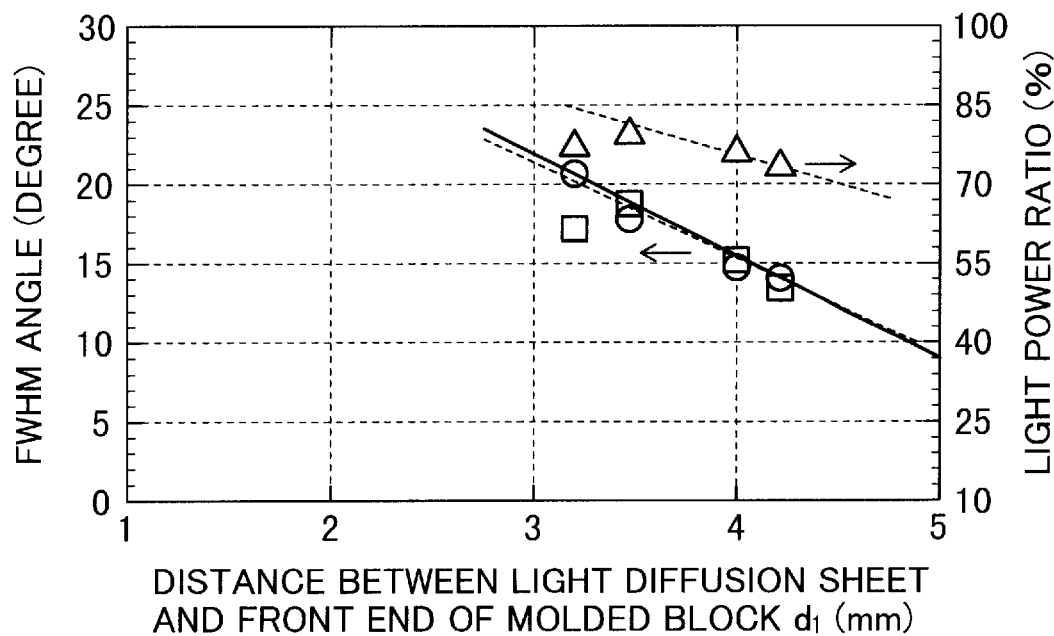
FIG. 3 is a graph showing a change in an angle corresponding to the full width of half maximum and a light power ratio of emitted light, when a distance between a light diffusion sheet and a front end of a molded block is changed.

FIG. 3 is a graph showing changes in an angle corresponding to the full width of half maximum (FWHM angle) and a light power ratio when the distance d1 is changed. The angle corresponding to the full width of half maximum means a divergence angle of beams in two directions whose power densities become a half of the maximum value. Square symbols and circle symbols in FIG. 3 represent the angles corresponding to the full width of half maximum, respectively in the YZ plane and ZX plane. The light power ratio is a $P_1/P_0$ where $P_0$ is a power of SL light radiated from SLD 6 and $P_1$ is a power of light radiated from the molded block 7 shown in FIG. 1 to the external space. Triangle symbols in FIG. 3 represent light power ratios $P_1/P_0$.

In FIG. 3, the abscissa represents the distance d1 in the unit of "mm", the left ordinate represents the angle corresponding to the full width of half maximum in the unit of "degree", and the right ordinate represents the light power ratio in the unit of "%". It can be seen that as the distance d1 is made long, the angle corresponding to the full width of half maximum becomes small. Namely, the light distribution characteristics can be controlled by changing the distance d1.

If SL light 20 radiated from SLD 6 is scattered by the light diffusion sheet 3 and these SLD 6 and light diffusion sheet 3 are molded in the molded block 5, a light power ratio of nearly 70% or more can be obtained. If fine particles which scatter light are dispersed in molding material, the light power is lowered greatly. However, by using the light diffusion sheet 3, the light power can be suppressed from being lowered.

Figure 4:
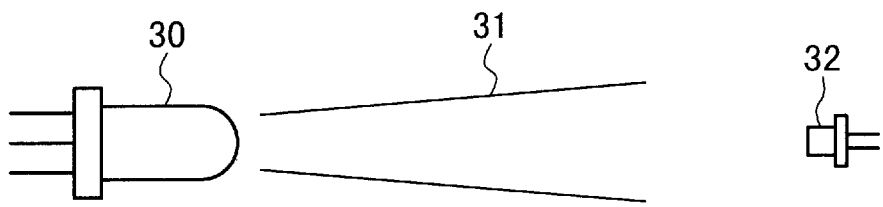
FIG. 4 is a schematic diagram of a spatial optical communication device using the light radiating device of the embodiment.

As shown in FIG. 4, spatial optical communication is possible by disposing a light receiving device 32 in the space in which light 31 radiated from the light radiating device 30 of the embodiment is propagated.

The present invention has been described in connection with the preferred embodiments. The invention is not limited only to the above embodiments. It is apparent that various modifications, improvements, combinations, and the like can be made by those skilled in the art.

What we claim are:

1. A light radiating device comprising:

a light radiating element;

a light diffusion sheet comprising a first plane and a second plane;

a light distributing member; and a molded block in which said light radiating element and said light diffusion sheet are embedded;

wherein said light diffusion sheet receives light fluxes radiated from said light radiating element at the first plane and scatters or diffracts the received light fluxes, and radiates the scattered or diffracted light from the second plane;

wherein said light distributing member distributes the light radiated from the second plane of said light diffusion sheet; and wherein a region of said molded block on which the light radiated from the second plane of said light diffusion sheet is incident has a convex surface, and the convex surface serves as said light distributing member.

2. A light radiating device according to claim 1, wherein said light radiating element radiates super luminescent light.

3. A spatial optical communication device comprising:

a light radiating device comprising a light radiating element, a light diffusion sheet, a light distributing member, and a molded block in which said light radiating element and said light diffusion sheet are embedded; and a light receiving element for receiving light distributed by said light distributing member of said light radiating device;

wherein said light diffusion sheet comprises a first plane and a second plane, and receives light fluxes radiated from said light radiating element at the first plane and scatters or diffracts the received light fluxes, and radiates the scattered or diffracted light from the second plane;

wherein said light distributing member distributes the light radiated from the second plane of said light diffusion sheet; and wherein a region of said molded block on which the light radiated from the second plane of said light diffusion sheet is incident has a convex surface, and the convex surface serves as said light distributing member.

4. A spatial optical communication device according to claim 3, wherein said light radiating element radiates super luminescent light.

* * * * *